United States Patent [19]

Cetronio

[11] 4,433,006
[45] Feb. 21, 1984

[54] PROCESS FOR OXIDIZING SEMICONDUCTING COMPOUNDS, ESPECIALLY GALLIUM ARSENIDE

[75] Inventor: Antonio Cetronio, Rome, Italy

[73] Assignee: Selenia Industrie Elettroniche Associate S.p.A., Rome, Italy

[21] Appl. No.: 383,179

[22] Filed: May 28, 1982

[30] Foreign Application Priority Data

May 29, 1981 [IT] Italy .................. 48581 A/81

[51] Int. Cl.³ .................. B05D 3/06; B05D 3/14; B05D 5/12
[52] U.S. Cl. .................. 427/39; 427/38
[58] Field of Search .................. 427/38, 39

[56] References Cited

U.S. PATENT DOCUMENTS 4,374,867  2/1983  Nahory et al. .................. 427/38

Primary Examiner—James R. Hoffman
Attorney, Agent, or Firm—Karl F. Ross

[57] ABSTRACT

In order to provide a semiconductive substrate such as gallium arsenide with an oxide layer, the substrate is positively biased in a plasma reactor in which an oxidizing gas is ionized by radiofrequency excitation while the substrate is heated to an elevated temperature increasing its conductivity. The substrate may be placed for this purpose on a graphite pedestal which is inductively heated from the same radiofrequency source.

5 Claims, 1 Drawing Figure

U.S. Patent  Feb. 21, 1984  4,433,006
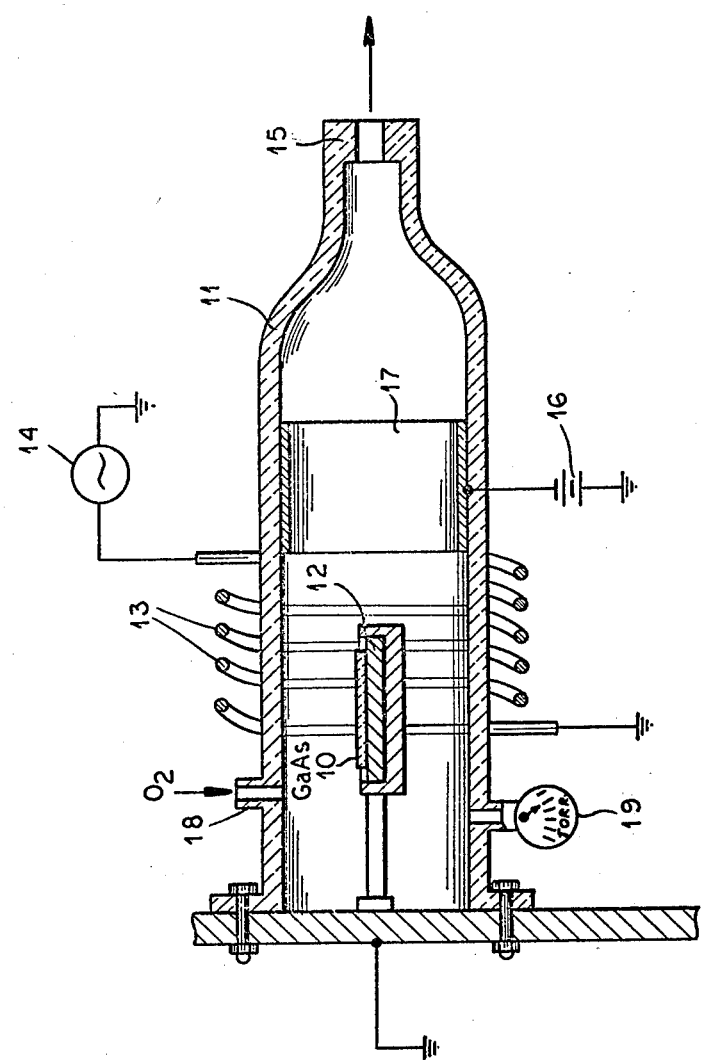

PROCESS FOR OXIDIZING SEMICONDUCTING COMPOUNDS, ESPECIALLY GALLIUM ARSENIDE

FIELD OF THE INVENTION

My present invention relates to a process designed to facilitate the oxidation of semiconductive compounds, in particular gallium arsenide.

BACKGROUND OF THE INVENTION

A semiconductive compound such as gallium arsenide is used in lasers, solar cells and solid-state circuit components such as transistors. In many instances it is necessary to provide a substrate of such a compound with an insulating oxide layer, e.g. in integrated structures of the MOS (metal-oxide-semiconductor) type or as an encapsulant of the substrate during ion implantation and subsequent thermal activation.

Gallium arsenide, in particular, can be directly oxidized only at high temperatures at which decomposition of the compound may become a problem. Other conventional techniques, such as anodic oxidation in a liquid electrolyte or in a gas plasma, are ineffective with semiconductors because of their high electrical resistivity. Thus, the practice has been to provide substances of gallium arsenide with insulating layers of unrelated oxides; this procedure is rather inconvenient and not very reliable since it gives rise to stresses at the semiconductor/oxide interface which in turn result in poor adhesion.

OBJECT OF THE INVENTION

The object of my present invention, therefore, is to provide an improved process for the oxidation of semiconductive compounds, especially gallium arsenide, in an efficient manner and with avoidance of excessively high temperatures.

SUMMARY OF THE INVENTION

I have found, in accordance with my present invention, that semiconductors of the type referred to need only be heated to relatively moderate temperatures in order to become sufficiently conductive to enable their oxidation in a gas plasma. With gallium arsenide, in particular, these temperatures lie in a range of about 400° to 500° C. which is well below the temperature needed for thermal oxidation. Thus, my improved process involves the placing of a substrate of a semiconductive compound in an atmosphere of highly ionized oxidating gas, applying an anodic bias to the substrate and heating same to an elevated temperature (on the order of hundreds of degrees C.) significantly reducing its electrical resistivity.

Advantageously, pursuant to a more particular feature of my invention, the gas is ionized by high-frequency discharges from a suitable source, preferably a radio-frequency oscillator, and the same source is used for heating the substrate by induction, either directly or through a thermally conductive support which could also be used for biasing purposes. The ionizable oxidizing atmosphere is preferably pure oxygen.

BRIEF DESCRIPTION OF THE DRAWING

The process according to my invention will now be described in greater detail with reference to the accompanying drawing the sole FIGURE of which shows a reactor used for the oxidation of a substrate of gallium arsenide.

SPECIFIC DESCRIPTION

As shown in the drawing, a GaAs substrate 10 is placed inside a plasma chamber 11 of vitreous material (e.g. "Pyrex") on a pedestal 12, such as a graphite block, in which it is exposed to an oxidizing gas activated by high-frequency discharges induced by the electromagnetic field of a surrounding coil 13 that is energized by a radio-frequency oscillator 14. The same field inductively heats the block 12 to a temperature between about 400° and 500° C., this block being in good heat-conducting contact with the substrate 10 and serving also to connect that substrate to the positive pole (ground) of a direct-current source 16 whose negative pole is tied to a cathode 17. Chamber 11 has an outlet 15 connected to a nonillustrated vacuum pump, an oxygen inlet 18, and a pressure gauge 19. The treatment is continued until an oxide layer of the desired thickness has been formed on the substrate 10. After cooling and removal from the reactor, the substrate so coated may be subjected to further processing, e.g. ion implantation through the oxide layer followed by a thermal after-treatment.

Among other semiconductive compounds to which my invention is applicable, indium phosphide (InP) may be mentioned by way of example. The optimum temperature during the oxidation treatment ranges between about 400° and 450° C. in this case.

I claim:

1. A process for providing a substrate of a semiconductive compound with an oxide layer, comprising the steps of placing said substrate in an atmosphere of highly ionized oxidizing gas, applying an anodic bias to said substrate, and heating said substrate to an elevated temperature significantly reducing the electrical resistivity of said compound.

2. A process as defined in claim 1 wherein said compound is gallium arsenide.

3. A process as defined in claim 2 wherein said elevated temperature ranges between substantially 400° and 500° C.

4. A process as defined in claim 1, 2 or 3 wherein the gas is ionized by high-frequency discharges, said substrate being inductively heated by high-frequency current inducing said discharges.

5. A process as defined in claim 4 wherein the inductively generated heat is transmitted to the substrate through a graphite support.

* * * * *